(12) United States Patent
Yano et al.

(10) Patent No.: US 9,331,226 B2
(45) Date of Patent: *May 3, 2016

(54) PHOTOVOLTAIC DEVICE

(71) Applicant: Panasonic Intellectual Property Management Co., Ltd., Osaka-shi, Osaka (JP)

(72) Inventors: Ayumu Yano, Hyogo (JP); Akiyoshi Ogane, Osaka (JP)

(73) Assignee: PANASONIC INTELLECTUAL PROPERTY MANAGEMENT CO., LTD. (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/134,743

(22) Filed: Dec. 19, 2013

(65) Prior Publication Data

US 2014/0102528 A1   Apr. 17, 2014

Related U.S. Application Data

(63) Continuation of application No. PCT/JP2012/057141, filed on Mar. 21, 2012.

(30) Foreign Application Priority Data

Jun. 30, 2011   (JP) ................................. 2011-145143

(51) Int. Cl.
  *H01L 31/0747*   (2012.01)
  *H01L 31/0687*   (2012.01)
  *H01L 31/0376*   (2006.01)

(52) U.S. Cl.
  CPC ...... *H01L 31/0687* (2013.01); *H01L 31/03762* (2013.01); *H01L 31/0747* (2013.01); *Y02E 10/548* (2013.01)

(58) Field of Classification Search
  None
  See application file for complete search history.

(56) References Cited

U.S. PATENT DOCUMENTS

2003/0103572 A1    6/2003  Lee et al.
2003/0168660 A1*   9/2003  Terakawa et al. ............... 257/52

(Continued)

FOREIGN PATENT DOCUMENTS

JP    2002-329878 A    11/2002
JP    2003-258287 A    9/2003

(Continued)

OTHER PUBLICATIONS

Kondo, et al. "Understanding of Passivation Mechanism in Heterojunction c-Si Solar Cells." Mater. Res. Soc. Symp. Proc., vol. 1066 (2008).*

(Continued)

*Primary Examiner* — James Lin
*Assistant Examiner* — William E McClain
(74) *Attorney, Agent, or Firm* — Cantor Colburn LLP (57) ABSTRACT

A photovoltaic device is provided having a semiconductor substrate, an i-type amorphous layer formed over a front surface of the semiconductor substrate, a p-type amorphous layer formed over the i-type amorphous layer, an i-type amorphous layer formed over a back surface of the semiconductor substrate, and an n-type amorphous layer formed over the i-type amorphous layer. The i-type amorphous layer and the i-type amorphous layer have oxygen concentration profiles in which concentrations are reduced in a step-shape from regions near interfaces with the semiconductor substrate and along a thickness direction, and an oxygen concentration in the step-shape portion of the i-type amorphous layer is higher than an oxygen concentration in the step-shape portion of the i-type amorphous layer.

4 Claims, 3 Drawing Sheets

(56) References Cited

U.S. PATENT DOCUMENTS

2003/0227017 A1 12/2003 Yasuno
2008/0230121 A1* 9/2008 Terakawa ................ 136/261

FOREIGN PATENT DOCUMENTS

JP 200414812 A 1/2004
WO 2009094578 A2 7/2009

OTHER PUBLICATIONS

Fujiwara, et al. "Optimization of interface structures in crystalline silicon heterojunction solar cells." Solar Energy Materials and Solar Cells, vol. 93, Jun. 2009, pp. 725-728.*
Mueller, et al. "Heterojunction Silicon Wafer Solar Cells using Amorphous Silicon Suboxides for Interface Passivation." Energy Procedia, vol. 15, 2012, pp. 97-106.*
Fujiwara, Hiroyuki et al. "Application of hydrogenated amorphous silicon oxide layers to c-Si heterojunction solar cells", Applied Physics Letters 91, 133508 (2007).

Mueller, Thomas et al. "Crystalline silicon surface passivation by high-frequency plasma-enhanced chemical-vapor-deposited nanocomposite silicon suboxides for solar cell applications", Journal of Applied Physics 107, 014504 (2010), 11 pp.
Extended European Search Report for Application No./Patnet No. 12804030.0-1508/2728622 PCT/JP2012057140, issued Nov. 12, 2014.
International Search Report for International application No. PCT/JP2012/057140; Date of Mailing: Apr. 17, 2012, with English Translation.
U.S. Non-Final Office Action for U.S. Appl. No. 14/134,496; dated Mar. 13, 2015.
Sritharathikun J. et al., "Optimization of amorphous silicon oxide buffer layer for high-efficiency p-type hydrogenated microcrystalline silicon oxide/n-type crystalline silicon heterojunction solar cells", Japanese Journal of Applied Physics.
Japanese Notice of Grounds for Rejection corresponding to Patent Application No. 2015-098695; Date of Mailing: Mar. 1, 2016, with English translation.

* cited by examiner

PHOTOVOLTAIC DEVICE

CROSS-REFERENCE TO RELATED APPLICATIONS

The present application is a continuation under 35 U.S.C. §120 of PCT/JP2012/057141, filed Mar. 21, 2012, which is incorporated herein by reference and which claimed priority to Japanese Patent Application No. 2011-145143 filed on Jun. 30, 2011. The present application likewise claims priority under 35 U.S.C. §119 to Japanese Patent Application No. 2011-145143 filed on Jun. 30, 2011, the entire content of which is also incorporated herein by reference.

BACKGROUND

1. Technical Field

The present invention relates to a photovoltaic device.

2. Related Art

Photovoltaic devices are known in which an amorphous silicon layer which is substantially intrinsic is formed between a crystalline silicon substrate and a doped amorphous silicon layer.

As a means for improving an output characteristic of the photovoltaic device having such a structure, a structure is known in which an oxygen concentration of an interface portion between the silicon substrate and the intrinsic amorphous silicon layer is increased (refer to Patent Document 1). In addition, a structure is known in which a slope is provided in the oxygen concentration in the intrinsic amorphous silicon layer, with the oxygen concentration of the side of the doped amorphous silicon layer being higher (refer to Patent Document 2).

On the other hand, it has been reported that in an inactivation technique of a surface of a silicon substrate by the intrinsic amorphous silicon layer, by containing oxygen in an appropriate amount in the entirety of the intrinsic amorphous silicon layer and forming a very small amorphous silicon oxide region within the layer, it is possible to promote the inactivation (refer to Non-Patent Document 1). In addition, it has been reported that by containing oxygen in an appropriate amount in the entirety of the intrinsic amorphous silicon layer, the output characteristic of the photovoltaic device can be improved (refer to Non-Patent Document 2).

RELATED ART REFERENCES

Patent Document

[Patent Document 1] Japanese Patent No. 4070483
[Patent Document 2] JP 2008-235400 A

Non-Patent Document

[Non-Patent Document 1] J. Appl. Phys. 107, 014504 (2010)
[Non-Patent Document 2] Appl. Phys. Lett. 91, 133508 (2007)

When excessive oxygen is introduced into the amorphous silicon layer, the oxygen may act as an impurity to form defects or form a high-resistance region. Therefore, optimization of the oxygen concentration to be contained is desired. However, the optimum oxygen concentration profile in the intrinsic amorphous silicon layer, in particular, the oxygen concentration at the side of the interface between the silicon substrate and the intrinsic amorphous silicon layer has not been sufficiently investigated.

Moreover, because the degree of inactivation of the defects by the oxygen differs depending on the conductive type (p-type or n-type) of the semiconductor layer in contact with the semiconductor substrate, realization of an appropriate oxygen concentration profile according to the conductive type is desired.

SUMMARY

According to one aspect of the present invention, there is provided a photovoltaic device comprising: a crystalline semiconductor substrate of an n-type; a first amorphous semiconductor layer which is intrinsic and formed over a first surface of the semiconductor substrate; a second amorphous semiconductor layer of a p-type and formed over the first amorphous semiconductor layer; a third amorphous semiconductor layer which is intrinsic and formed over a second surface, opposite to the first surface, of the semiconductor substrate; and a fourth amorphous semiconductor layer of an n-type and formed over the third amorphous semiconductor layer, wherein each of the first amorphous semiconductor layer and the third amorphous semiconductor layer has an oxygen concentration profile in which a concentration is reduced in a step-shape from a region near an interface with the semiconductor substrate and along a thickness direction, and an oxygen concentration in the step-shape portion of the first amorphous semiconductor layer is higher than an oxygen concentration in the step-shape portion of the third amorphous semiconductor layer.

ADVANTAGEOUS EFFECTS

According to various aspects of the present invention, a photovoltaic efficiency in the photovoltaic device can be improved.

DETAILED DESCRIPTION

Figure 1:
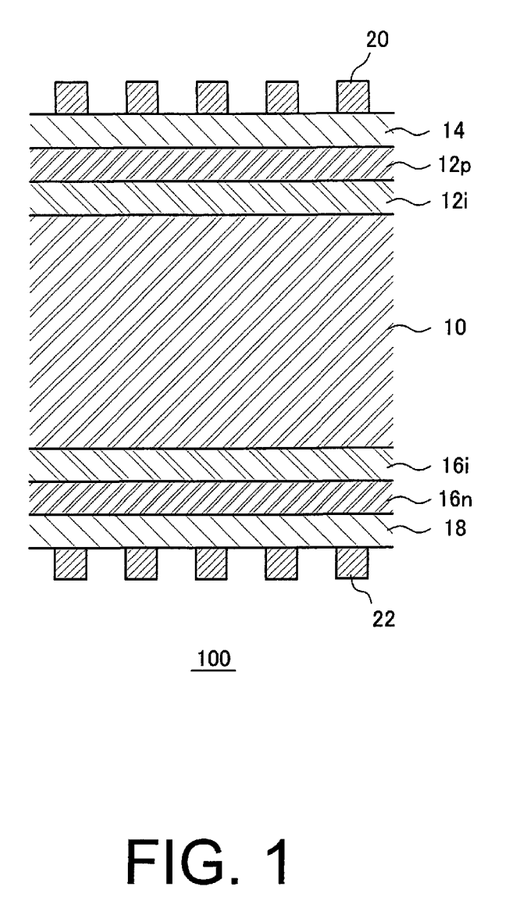
FIG. 1 is a cross-sectional diagram of a photovoltaic device according to a preferred embodiment of the present invention.

As shown in a cross-sectional diagram of FIG. 1, a photovoltaic device 100 according to a preferred embodiment of the present invention comprises a semiconductor substrate 10, an i-type amorphous layer 12$i$, a p-type amorphous layer 12$p$, a transparent conductive layer 14, an i-type amorphous layer 16$i$, an n-type amorphous layer 16$n$, a transparent conductive layer 18, and collecting electrodes 20 and 22.

A structure of the photovoltaic device 100 will now be described while showing a method of producing the photovoltaic device 100. TABLE 1 shows example formation conditions of amorphous layers in the photovoltaic device 100. The film formation conditions used in the present embodiment are merely exemplary, and may be suitably changed and optimized according to the device to be used.

TABLE 1

| PROCESS | SUBSTRATE TEMPERATURE [° C.] | GAS | PRESSURE [Pa] | POWER DENSITY [mW/cm$^2$] |
|---|---|---|---|---|
| i-TYPE AMORPHOUS LAYER 12i | 150~250 | H$_2$: 100~300 sccm<br>SiH$_4$: 10~50 sccm<br>CO$_2$: 0~50 sccm | 10~100 | 1~10 |
| p-TYPE AMORPHOUS LAYER 12p | 150~250 | H$_2$: 100~300 sccm<br>SiH$_4$: 10~50 sccm<br>B$_2$H$_6$: 10~50 sccm | 10~100 | 1~10 |
| i-TYPE AMORPHOUS LAYER 16i | 150~250 | H$_2$: 100~300 sccm<br>SiH$_4$: 10~50 sccm<br>CO$_2$: 0~50 sccm | 10~100 | 1~10 |
| n-TYPE AMORPHOUS LAYER 16n | 150~250 | H$_2$: 100~300 sccm<br>SiH$_4$: 10~50 sccm<br>PH$_3$: 10~50 sccm | 10~100 | 1~10 |

The semiconductor substrate 10 comprises a crystalline semiconductor material. The semiconductor substrate 10 may be a crystalline semiconductor substrate of an n-type conductivity or a p-type conductivity. As the semiconductor substrate 10, for example, a monocrystalline silicon substrate, a polycrystalline silicon substrate, a gallium arsenide substrate (GaAs), an indium phosphide substrate (InP) or the like may be employed. The semiconductor substrate 10 absorbs incident light and produces carrier pairs of electrons and holes through photoelectric conversion. In the following description, an example configuration will be described in which an n-type monocrystalline silicon substrate is used as the semiconductor substrate 10.

The semiconductor substrate 10 is placed in a film formation chamber after being cleaned. The cleaning of the semiconductor substrate 10 can be performed using an etchant of hydrofluoric acid (HF etchant) or an RCA cleaning solution. Alternatively, a textured structure may be preferably formed on a front surface or a back surface of the semiconductor substrate 10 using alkaline etchant such as a potassium hydroxide etchant (KOH etchant). In this case, the semiconductor substrate 10 having the (100)-plane may be anisotropically etched using the KOH etchant, to form a texture structure having a pyramid type (111)-plane. Alternatively, a predetermined oxidization process may be applied before the formation of the i-type amorphous layer 12i to form an oxidized interface. As the predetermined oxidation process, for example, the substrate may be placed in an atmospheric air environment or in a humidity-controlled atmosphere for a predetermined period of time, or an ozone water process, a hydrogen peroxide water process, an ozonizing process, or the like may be suitably employed.

The i-type amorphous layer 12i, which is an amorphous semiconductor layer, is formed over a front surface of the semiconductor substrate 10. For example, the i-type amorphous layer 12i is an amorphous intrinsic silicon semiconductor layer containing hydrogen. Here, an intrinsic semiconductor layer refers to a semiconductor layer with a concentration of contained p-type or n-type dopant of less than or equal to 5×10$^{18}$/cm$^3$, or, when the p-type dopant and the n-type dopant are both contained, a semiconductor layer with a difference of the dopant concentrations of the p-type and n-type of less than or equal to 5×10$^{18}$/cm$^3$. The i-type amorphous layer 12i is preferably formed sufficiently thin to inhibit absorption of light as much as possible and at the same time, sufficiently thick for passivation of the front surface of the semiconductor substrate 10. The thickness of the i-type amorphous layer 12i is preferably in a range of greater than or equal to 1 nm and less than or equal to 25 nm, and more preferably in a range of greater than or equal to 5 nm and less than or equal to 10 nm.

The i-type amorphous layer 12i can be formed through plasma-enhanced chemical vapor deposition (PECVD), Cat-CVD (Catalytic Chemical Vapor Deposition), sputtering, or the like. For the PECVD, any of RF plasma CVD, VHF plasma CVD having a high frequency, microwave plasma CVD, or the like may be employed. In the present embodiment, a configuration using RF plasma CVD will be described. For example, as shown in TABLE 1, the i-type amorphous layer 12i can be formed by supplying a silicon-containing gas such as silane (SiH$_4$) diluted by hydrogen, which is turned into plasma by applying RF high-frequency electric power to a parallel-plate electrode or like, to a film formation surface of the semiconductor substrate 10 which is heated. In this process, in the present embodiment, gas containing oxygen (O$_2$) is simultaneously introduced at an initial stage of the formation of the i-type amorphous layer 12i, to introduce oxygen to a region near the interface between the semiconductor substrate 10 and the i-type amorphous layer 12i. The gas containing oxygen (O$_2$) may be, for example, carbon dioxide (CO$_2$) gas and oxygen (O$_2$). A substrate temperature during the film formation is set in a range of higher than or equal to 150° C. and lower than or equal to 250° C., and an RF power density is set in a range of greater than or equal to 1 mW/cm$^2$ and less than or equal to 10 mW/cm$^2$.

Figure 2:
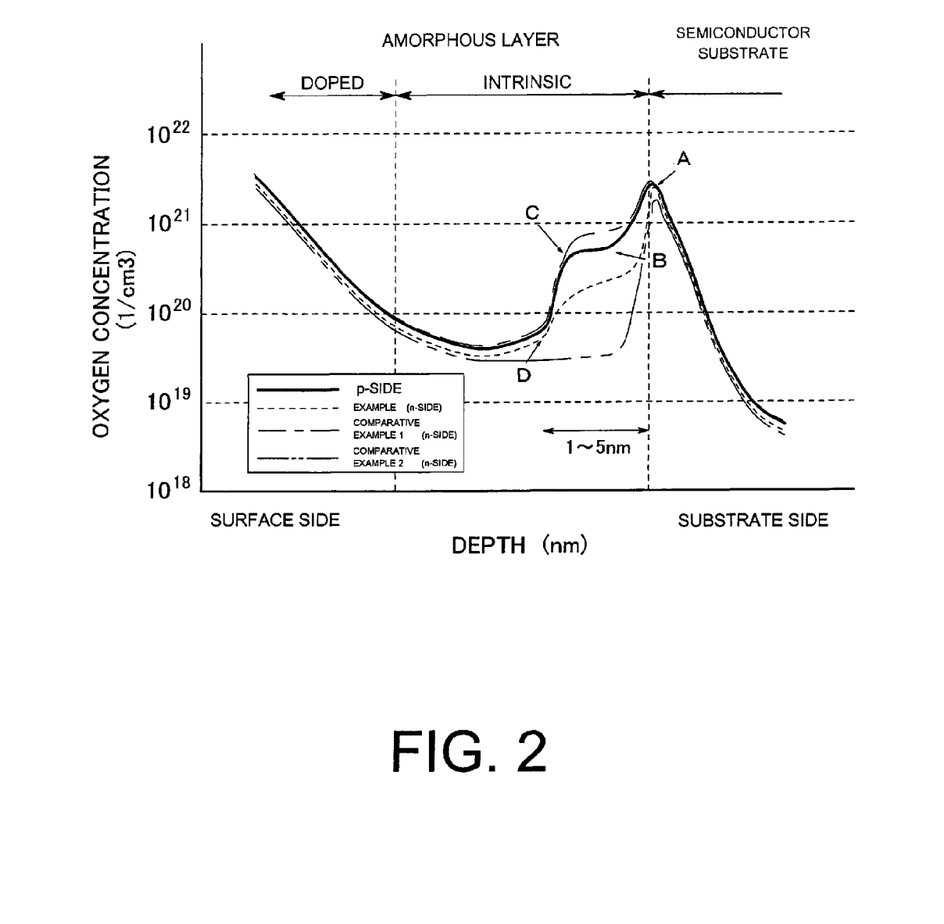
FIG. 2 is a diagram showing an oxygen concentration profile of a photovoltaic device according to a preferred embodiment of the present invention.

As shown in FIG. 2, an oxygen concentration profile is employed in the i-type amorphous layer 12i in which the oxygen concentration is reduced in a step-shape from a region near the interface between the semiconductor substrate 10 and the i-type amorphous layer 12i along the thickness direction of the i-type amorphous layer 12i. For example, a flow rate of the oxygen-containing gas is changed in a step-shape during the formation of the i-type amorphous layer 12i, to form a high-oxygen-concentration region containing a large amount of oxygen only on the side of the interface with the semiconductor substrate 10. The oxygen concentration in the high-oxygen-concentration region is preferably set in a range of greater than or equal to approximately 2×10$^{20}$/cm$^3$ and less than or equal to 1×10$^{21}$/cm$^3$, and the oxygen concentration in regions of the i-type amorphous layer 12i other than the high-oxygen-concentration region is preferably set to be less than approximately 1×10$^{20}$/cm$^3$. In addition, in the high-oxygen-concentration region, a step-shaped profile having one or more steps of oxygen concentrations along the thickness direction is preferably employed. This oxygen concentration profile of the semiconductor substrate 10 and characteristics of the photovoltaic device will be described later.

Concentrations of various elements in a semiconductor film can be measured through secondary ion mass spectrometry (SIMS) or the like. When the texture structure is provided in the semiconductor substrate 10, the concentrations of various elements in the film can be measured by a method in which the resolution in the thickness direction is not reduced by the texture.

The p-type amorphous layer 12p is a layer comprising an amorphous semiconductor film containing a dopant of a p-type conductivity. For example, the p-type amorphous layer 12p is formed by amorphous silicon containing hydrogen. The p-type amorphous layer 12p has a higher concentration of the p-type dopant in the film than that of the i-type amorphous layer 12i. For example, the p-type amorphous layer 12p preferably has a concentration of the p-type dopant of greater than or equal to $1 \times 10^{20}/cm^3$. A thickness of the p-type amorphous layer 12p is preferably sufficiently thin to inhibit absorption of light as much as possible, and at the same time, sufficiently thick to efficiently separate carriers generated in the semiconductor substrate 10 at the pn junction and to collect the generated carriers in the transparent conductive layer 14. For example, the thickness of the p-type amorphous layer 12p is preferably set in a range of greater than or equal to 1 nm and less than or equal to 10 nm.

The p-type amorphous layer 12p can also be formed through PECVD, Cat-CVD, sputtering, or the like. For the PECVD, RF plasma CVD may be applied. For example, as shown in TABLE 1, the p-type amorphous layer 12p can be formed by supplying a silicon-containing gas such as silane ($SiH_4$) and a p-type dopant-containing gas such as diborane ($B_2H_6$) diluted by hydrogen, which is turned into plasma by applying RF high-frequency electric power to a parallel-plate electrode or like, over the i-type amorphous layer 12i of the semiconductor substrate 10 which is heated. In TABLE 1, diborane ($B_2H_6$) is diluted with hydrogen in a percentage of 1%. A substrate temperature during the film formation is preferably set in a range of higher than or equal to 150° C. and lower than or equal to 250° C., and an RF power density is preferably set in a range of greater than or equal to 1 mW/cm$^2$ and less than or equal to 10 mW/cm$^2$.

The i-type amorphous layer 16i is formed over a back surface of the semiconductor substrate 10. Specifically, after the i-type amorphous layer 12i and the p-type amorphous layer 12p are formed, the semiconductor substrate 10 is flipped to turn the front and back sides over, and the i-type amorphous layer 16i is formed over the back surface of the semiconductor substrate 10. For example, the i-type amorphous layer 16i is an amorphous intrinsic silicon semiconductor layer containing hydrogen. Similar to the i-type amorphous layer 12i, a thickness of the i-type amorphous layer 16i is preferably in a range of greater than or equal to 1 nm and less than or equal to 25 nm, and more preferably in a range of greater than or equal to 5 nm and less than or equal to 10 nm.

The i-type amorphous layer 16i can be formed through PECVD, Cat-CVD, sputtering, or the like. For the PECVD, RF plasma CVD may be employed. For example, as shown in TABLE 1, the i-type amorphous layer 16i can be formed by supplying a silicon-containing gas such as silane ($SiH_4$) diluted by hydrogen, which is turned into plasma by applying RF high-frequency electric power to a parallel-plate electrode or like, to a film formation surface of the semiconductor substrate 10 which is heated. Similar to the i-type amorphous layer 12i, a substrate temperature during the film formation is preferably set in a range of higher than or equal to 150° C. and lower than or equal to 250° C., and an RF power density is preferably set in a range of greater than or equal to 1 mW/cm$^2$ and less than or equal to 10 mW/cm$^2$.

In the i-type amorphous layer 16i also, similar to the i-type amorphous layer 12i, gas containing oxygen ($O_2$) is preferably simultaneously introduced during an initial stage of the film formation, to introduce oxygen in a region near an interface between the semiconductor substrate 10 and the i-type amorphous layer 16i.

Here, as shown in FIG. 2, an oxygen concentration profile is employed in the i-type amorphous layer 16i in which the oxygen concentration is reduced in a step-shape from the region near the interface between the semiconductor substrate 10 and the i-type amorphous layer 16i along the thickness direction of the i-type amorphous layer 16i. For example, a flow rate of the oxygen-containing gas is changed in a step-shape during the formation of the i-type amorphous layer 16i, to form a high-oxygen-concentration region having a large amount of oxygen only on the side of the interface with the semiconductor substrate 10.

The high-oxygen-concentration region of the i-type amorphous layer 16i is set to have a lower oxygen concentration than that of the high-oxygen-concentration region of the i-type amorphous layer 12i. More specifically, the oxygen concentration in the high-oxygen-concentration region of the i-type amorphous layer 16i is set in a range of greater than or equal to approximately $1 \times 10^{20}/cm^3$ and less than or equal to $9 \times 10^{20}/cm^3$. In addition, the oxygen concentrations in regions other than the high-oxygen-concentration region of the i-type amorphous layer 16i is preferably set to be less than approximately $1 \times 10^{20}/cm^3$. Moreover, the high-oxygen-concentration region has a profile of a step-shape having one or more steps of the oxygen concentrations along the thickness direction. This oxygen concentration profile from the semiconductor substrate 10 and the characteristics of the photovoltaic device will be described later.

The n-type amorphous layer 16n is a layer of an amorphous semiconductor film containing a dopant of an n-type conductivity. For example, the n-type amorphous layer 16n is formed by amorphous silicon containing hydrogen. The n-type amorphous layer 16n is set to have a higher concentration of the n-type dopant in the film than that of the i-type amorphous layer 16i. For example, the n-type amorphous layer 16n preferably has a concentration of the n-type dopant of greater than or equal to $1 \times 10^{20}/cm^3$. A thickness of the n-type amorphous layer 16n is preferably sufficiently thin to inhibit absorption of light as much as possible, and sufficiently thick to effectively separate the carriers generated in the semiconductor substrate 10 by a BSF (Back Surface Field) structure and to efficiently collect the generated carriers in the transparent conductive layer 18. For example, the thickness of the n-type amorphous layer 16n is preferably in a range of greater than or equal to 1 nm and less than or equal to 10 nm.

The n-type amorphous layer 16n also can be formed through PECVD, Cat-CVD, sputtering, or the like. For the PECVD, RF plasma CVD may be employed. For example, as shown in TABLE 1, the n-type amorphous layer 16n can be formed by supplying a silicon-containing gas such as silane ($SiH_4$) and an n-type dopant-containing gas such as phosphine ($PH_3$) diluted by hydrogen, which is turned into plasma by applying RF high-frequency electric power to a parallel-plate electrode or like, over the i-type amorphous layer 16i of the semiconductor substrate 10 which is heated. In TABLE 1, phosphine ($PH_3$) is diluted with hydrogen with a percentage of 2%. A substrate temperature during the film formation is preferably set in a range of higher than or equal to 150° C. and lower than or equal to 250° C., and an RF power density is preferably set in a range of greater than or equal to 1 mW/cm$^2$ and less than or equal to 10 mW/cm$^2$.

A front surface side of the semiconductor substrate 10 is set as a light-receiving surface (a surface mainly through which the light is introduced from the outside). In addition, in the above-described embodiment, after the i-type amorphous layer 12i and the p-type amorphous layer 12p on the front surface side are formed, the semiconductor substrate 10 is flipped and the i-type amorphous layer 16i and the n-type amorphous layer 16n on the back surface side are formed, but the order of formation of these layers is arbitrary.

The transparent conductive layers 14 and 18 are formed over the p-type amorphous layer 12p and the n-type amorphous layer 16n, respectively. The transparent conductive layers 14 and 18 are formed, for example, including at least one of metal oxides having a polycrystalline structure, such as indium oxide ($In_2O_3$), zinc oxide (ZnO), tin oxide ($SnO_2$), and titanium oxide ($TiO_2$), and the metal oxide may be doped with a dopant such as tin (Sn), zinc (Zn), tungsten (W), antimony (Sb), titanium (Ti), cerium (Ce), and gallium (Ga). The transparent conductive layers 14 and 18 may be formed through a thin film formation method such as deposition, plasma-enhanced chemical vapor deposition (PECVD), and sputtering. Thicknesses of the transparent conductive layers 14 and 18 can be suitably adjusted according to the indices of refraction of the transparent conductive layers 14 and 18, and in the present embodiment, the thicknesses are set in a range of greater than or equal to 70 nm and less than or equal to 100 nm.

The collecting electrodes 20 and 22 are formed over the transparent conductive layers 14 and 18, respectively. The collecting electrodes 20 and 22 preferably have a comb-shaped finger electrode structure. The collecting electrodes 20 and 22 can be formed through screen printing, coating, or the like. The collecting electrodes 20 and 22 are formed, for example, by applying a silver paste or the like to a thickness of a few tens of μm.

EXAMPLE and COMPARATIVE EXAMPLES 1 and 2

A photovoltaic device having an i-type amorphous layer 12i having an oxygen concentration profile in which the concentration is reduced in a step-shape from a region near the interface between the semiconductor substrate 10 and the i-type amorphous layer 12i along the thickness direction, and an i-type amorphous layer 16i having an oxygen concentration profile in which the concentration is reduced from a region near the interface between the semiconductor substrate 10 and the i-type amorphous layer 16i along the thickness direction, formed through the above-described formation method and under the conditions shown in TABLE 1, is set as the Example. In this case, an amount of introduction of oxygen-containing gas when the i-type amorphous layer 12i on the side of the p-type amorphous layer 12p was formed was set greater than that when the i-type amorphous layer 16i on the side of the n-type amorphous layer 16n was formed.

A photovoltaic device which was formed similar to the Example, except that the oxygen-containing gas such as carbon dioxide gas was not introduced during the formation of the i-type amorphous layer 16i on the side of the n-type amorphous layer 16n, is set as Comparative Example 1. A photovoltaic device which was formed similar to the Example, except that the amount of introduction of the oxygen-containing gas during the formation of the i-type amorphous layer 16i on the side of the n-type amorphous layer 16n was set greater than that during the formation of the i-type amorphous layer 12i on the side of the p-type amorphous layer 12p, is set as Comparative Example 2.

Figure 3:
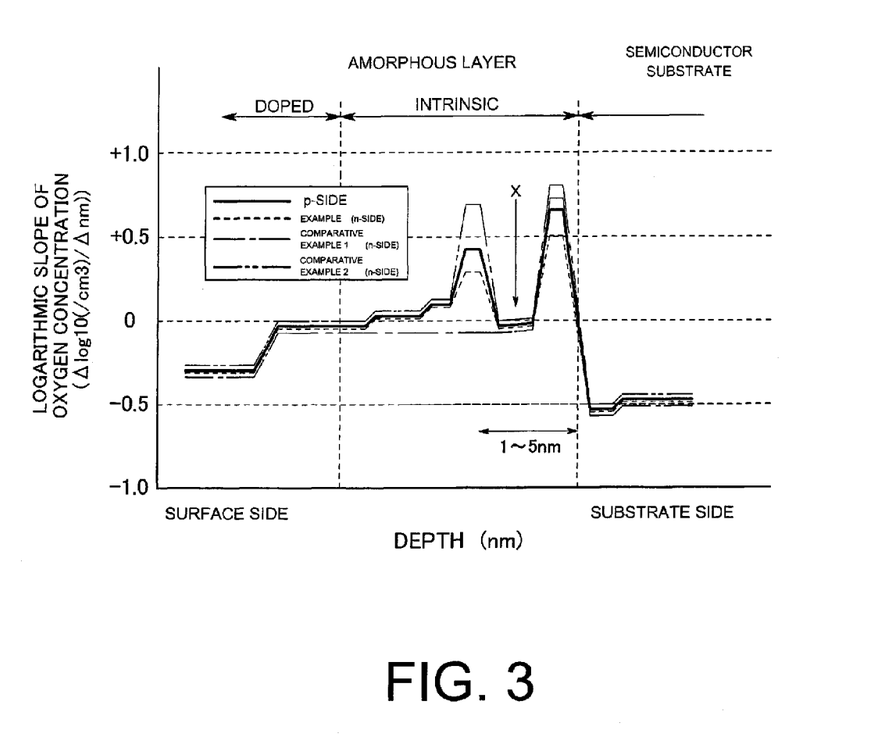
FIG. 3 is a diagram showing a slope profile in a logarithmic scale of an oxygen concentration of a photovoltaic device according to a preferred embodiment of the present invention.

FIG. 2 shows the concentration profile of oxygen atoms in the films for the semiconductor substrate 10, the i-type amorphous layer 12i, and the p-type amorphous layer 12p in the Example (hereinafter referred to as "p-side concentration profile"), and concentration profiles of oxygen atoms in the films for the semiconductor substrate 10, the i-type amorphous layer 16i, and the n-type amorphous layer 16n in the Example and the Comparative Examples 1 and 2 (hereinafter referred to as "n-side concentration profile"). In FIG. 2, the p-side concentration profile in the Example is shown with a solid line and the n-side concentration profiles in the Example and the Comparative Examples 1 and 2 are shown with a broken line, a dot-and-chain line, and a two-dots-and-chain line, respectively. FIG. 3 shows in a logarithmic scale a slope of the oxygen concentration profile obtained by differentiating the oxygen concentration profile shown in FIG. 2 in the thickness direction.

In all of the Example and the Comparative Examples 1 and 2, oxygen atoms in the order of $10^{21}/cm^3$ were present as a peak concentration at the interfaces between the i-type amorphous layers 12i and 16i and the semiconductor substrate 10. This is because the surface of the semiconductor substrate 10 is naturally oxidized in a transportation period from cleaning to the formation processes of the i-type amorphous layers 12i and 16i, and also in the film formation device. Moreover, in a case where a predetermined oxidization process is applied prior to the film formation as described above, the oxygen concentration peak is caused due to this process. Because of this, the oxygen concentrations of the i-type amorphous layers 12i and 16i showed profiles having peaks at the interfaces with the semiconductor substrate 10, which are reduced to the back ground level in the i-type amorphous layers 12i and 16i, and again increased toward the p-type amorphous layer 12p, the n-type amorphous layer 16n, and the surface. The increase in the oxygen concentration in the p-type amorphous layer 12p and the n-type amorphous layer 16n can be considered to be an influence of introduction of the doping gas and an influence on the surface in the measurement.

In the p-side concentration profile in the Example, a region containing a large amount of oxygen (high-oxygen-concentration region) near the interface with the semiconductor substrate 10 was observed in a range of less than or equal to 5 nm from the interface with the semiconductor substrate 10. The oxygen concentration in the high-oxygen-concentration region was in a range of greater than or equal to approximately $1 \times 10^{20}/cm^3$ and less than or equal to $1 \times 10^{21}/cm^3$. In addition, in the i-type amorphous layer 12i, the oxygen concentration in regions other than the high-oxygen-concentration region was less than approximately $1 \times 10^{20}/cm^3$.

Moreover, the high-oxygen-concentration region had a profile of a step-shape having one or more steps of oxygen concentrations along the thickness direction. In other words, the oxygen concentration profile near the interface with the semiconductor substrate 10 in the i-type amorphous layer 12i had one or more points of inflection, and had regions having different slopes. More specifically, there had been confirmed, as the inflection points, a point A which is at the interface between the semiconductor substrate 10 and the i-type amorphous layer 12i and having an oxygen concentration in the order of $10^{21}/cm^3$, a point B in the i-type amorphous layer 12i and in a range of about 1 nm from the interface between the semiconductor substrate 10 and the i-type amorphous layer 12i, and having an oxygen concentration in a range of greater than or equal to approximately $1 \times 10^{20}/cm^3$ and less than or equal to $1 \times 10^{21}/cm^3$, a point C in the i-type amorphous layer 12i and in an approximate range of greater than or equal to 1 nm and less than or equal to 5 nm from the interface between the semiconductor substrate 10 and the i-type amorphous layer 12i, and having an oxygen concentration in a range of greater than or equal to approximately $1\times10^{20}/cm^3$ and less than or equal to $1\times10^{21}/cm^3$, and a point D in the i-type amorphous layer 12i and distanced from the interface between the semiconductor substrate 10 and the i-type amorphous layer 12i by about 5 nm and having an oxygen concentration of less than or equal to approximately $1\times10^{20}/cm^3$. Such an oxygen concentration profile was more clearly confirmed when the concentration axis was shown logarithmically.

In the slope of the logarithm of the oxygen concentration profiled shown in FIG. 3, as the position approaches from the surface side toward the semiconductor substrate 10, the slope was increased from a shallow position in the i-type amorphous layer 12i and showed a peak. The slope then became gradual and approaches 0, and the slope was again increased from a point distanced from the interface between the semiconductor substrate 10 and the i-type amorphous layer 12i by a few nm. Thus, the profile of the slope of the oxygen concentration had at least two peaks within the i-type amorphous layer 12i.

Such an oxygen concentration profile was also similarly obtained in the p-side concentration profiles in the Example and the Comparative Examples 1 and 2, and in the n-side concentration profiles in the Example and the Comparative Example 2.

The oxygen concentration of approximately $1\times10^{20}/cm^3$ technically has the following critical meaning. Because the densities of the silicon atoms in the i-type amorphous layers 12i and 16i are approximately $5\times10^{22}/cm^3$, when the oxygen concentration is approximately $1\times10^{20}/cm^3$, the concentration ratio of the oxygen atoms with respect to the silicon atoms is 0.002. With a value near this value as a boundary, it can be considered that when the oxygen concentration is lower than 0.002, the oxygen atoms act as impurities in silicon, and when the oxygen concentration is higher than 0.002, the oxygen atoms are alloyed with silicon and the film has properties as a compound of oxygen and silicon. Therefore, the properties of the i-type amorphous layers 12i and 16i can be considered to change with the boundary at the oxygen concentration of approximately $1\times10^{20}/cm^3$. As the oxygen atoms in the semiconductor layer of the present embodiment have a very low carrier activation percentage, the amorphous layers 12i and 16i containing oxygen in the concentration according to the present embodiment are substantially intrinsic.

TABLE 2 shows output characteristics of photovoltaic devices of the Example and the Comparative Examples 1 and 2. Measured data were an open circuit voltage (Voc), a short circuit current (Isc), a fill factor (FF), and an output voltage (Pmax). In TABLE 2, normalized values which were normalized against the values in the Comparative Example 1 as 1 are shown.

TABLE 2

|  | OPEN CIRCUIT VOLTAGE Voc | SHORT CIRCUIT CURRENT Isc | FILL FACTOR FF | OUTPUT Pmax |
| --- | --- | --- | --- | --- |
| EXAMPLE | 1.003 | 1.001 | 1.00 | 1.004 |
| COMPARATIVE EXAMPLE 1 | 1.000 | 1.000 | 1.000 | 1.000 |
| COMPARATIVE EXAMPLE 2 | 1.003 | 1.001 | 0.990 | 0.994 |

An improvement in the open circuit voltage can be confirmed in the Example and the Comparative Example 2 over the photovoltaic device of the Comparative Example 1 in which oxygen was not intentionally introduced to the i-type amorphous layer 16i on the n-side. This can be considered to be due to the fact that because the oxygen concentrations near the interfaces with the semiconductor substrate 10 in the i-type amorphous layer 12i and 16i were high in the Example and the Comparative Example 2 compared with the Comparative Example 1, the defects at the interfaces between the semiconductor substrate 10 and the i-type amorphous layers 12i and 16i were effectively inactivated (terminated), and re-combination of carriers having a defect as the re-combination center was inhibited.

With regard to the short circuit current Isc, no significant difference was found among the Example and the Comparative Examples 1 and 2.

With regard to the fill factor FF, no significant difference was found between the Example and the Comparative Example 1. However, in the Comparative Example 2, the fill factor FF was reduced compared with the Example and the Comparative Example 1. The fill factor FF is a characteristic which primarily depends on the resistance and the inactivation of the surface. It can be deduced that, in the Example, the improvement of the fill factor FF caused by the inactivation by containing oxygen in the range of 5 nm from the interfaces between the semiconductor substrate 10 and the i-type amorphous layers 12i and 16i, and the reduction of the fill factor FF due to an increase of the resistance caused by the oxygen introduction, canceled each other out, resulting in a similar fill factor FF to that of the Comparative Example 1. On the other hand, in the Comparative Example 2, it can be deduced that oxygen in an amount greater than a suitable amount was introduced to the i-type amorphous layer 16i on the n-side, resulting in the increased resistance of the i-type amorphous layer 16i and saturation of the advantage of the inactivation of the defects by the oxygen, which consequently resulted in the worsened fill factor FF.

When the oxygen concentrations of the i-type amorphous layer 12i on the p-side and the i-type amorphous layer 16i on the n-side are equal to each other, the inactivation percentage of the hetero-interface between the semiconductor substrate 10 and the i-type amorphous layer 16i on the n-side would be higher than the inactivation percentage of the hetero-interface between the semiconductor substrate 10 and the i-type amorphous layer 12i on the p-side. In addition, in the characteristic of the photovoltaic device, a film having a lower inactivation percentage of the hetero-interface becomes dominant. Thus, the oxygen concentration of the i-type amorphous layer 12i on the p-side is preferably set higher than the oxygen concentration of the i-type amorphous layer 16i on the n-side so that the inactivation percentages are similar between the hetero-interface of the semiconductor substrate 10 and the i-type amorphous layer 12i and the hetero-interface of the semiconductor substrate 10 and the i-type amorphous layer 16i. On the other hand, when the oxygen concentration of the i-type amorphous layer 16i becomes too much greater than the oxygen concentration of the i-type amorphous layer 12i, the improvement in the inactivation percentage in the hetero-interface between the semiconductor substrate 10 and the i-type amorphous layer 16i on the n-side would have almost no influence on the characteristic of the photovoltaic device 100. However, because the resistance of the film is increased, the characteristic of the photovoltaic device is reduced. In other words, the oxygen concentration near the interface between the i-type amorphous layer 12i on the p-side and the semiconductor substrate 10 (high-oxygen-concentration region) is preferably higher than the oxygen concentration near the interface between the i-type amorphous layer 16i on the n-side and the semiconductor substrate 10 (high-oxygen-concentration region), within the optimum range of the oxygen concentration, as in the Example. In other words, a configuration is preferably employed in which the oxygen concentration at a position X between two peaks in the slope of the oxygen concentration profile shown in FIG. 3 is higher in the i-type amorphous layer 12i on the p-side than in the i-type amorphous layer 16i on the n-side.

As a result of the above, the output power Pmax was maximum in the Example. More specifically, with reference to the Comparative Example 1, the output Pmax of the Example was 1.004. It can be deduced that with the reduction of defects near the interface with the semiconductor substrate 10 and effective introduction of light to the semiconductor substrate 10, the open circuit voltage Voc and the short circuit current Isc were improved, and at the same time, with inhibition of reduction of the fill factor FF, the power generation efficiency was improved.

What is claimed is:

1. A photovoltaic device comprising:
   a crystalline semiconductor substrate of a first conductive type;
   a first amorphous semiconductor layer which is intrinsic and formed over a first surface of the semiconductor substrate;
   a second amorphous semiconductor layer of a second conductive type opposite to the first conductive type and formed over the first amorphous semiconductor layer;
   a third amorphous semiconductor layer which is intrinsic and formed over a second surface, opposite to the first surface, of the semiconductor substrate; and
   a fourth amorphous semiconductor layer of the first conductive type and formed over the third amorphous semiconductor layer,
   wherein an oxygen concentration in a high-oxygen-concentration region within 5 nm near the interface between the crystalline semiconductor substrate and each of the first amorphous semiconductor layer and the third amorphous semiconductor layer is greater than or equal to $1\times10^{20}/cm^3$ and less than or equal to $1\times10^{21}/cm^3$,
   wherein a profile of the oxygen concentration in each of the high-oxygen concentration regions is reduced in a step shape near an interface with the semiconductor substrate along a thickness direction, and a slope of each of the profiles has at least two peaks,
   and the oxygen concentration in the high-oxygen concentration region of the first amorphous semiconductor layer is higher than an oxygen concentration in the high-oxygen concentration region of the third amorphous semiconductor layer,
   and wherein an oxygen concentration in regions in the first amorphous semiconductor layer other than the high-oxygen-concentration region is less than $1\times10^{20}/cm^3$.

2. The photovoltaic device according to claim 1, wherein an oxygen concentration in a high-oxygen-concentration region which is a region within 5nm near the interface between the semiconductor substrate and the first amorphous semiconductor layer is greater than or equal to $2\times10^{20}/cm^3$ and less than or equal to $1\times10^{21}/cm^3$.

3. The photovoltaic device according to claim 1, wherein an oxygen concentration in a high-oxygen-concentration region which is a region within 5 nm near the interface between the semiconductor substrate and the third amorphous semiconductor layer is greater than or equal to $1\times10^{20}/cm^3$ and less than or equal to $9\times10^{20}/cm^3$.

4. The photovoltaic device according to claim 2, wherein an oxygen concentration in a high-oxygen-concentration region which is a region within 5 nm near an interface between the semiconductor substrate and the third amorphous semiconductor layer is greater than or equal to $1\times10^{20}/cm^3$ and less than or equal to $9\times10^{20}/cm^3$.

* * * * *